US007282324B2

(12) United States Patent
Weber et al.

(10) Patent No.: US 7,282,324 B2
(45) Date of Patent: Oct. 16, 2007

(54) PHOTORESIST COMPOSITIONS, HARDENED FORMS THEREOF, HARDENED PATTERNS THEREOF AND METAL PATTERNS FORMED USING THEM

(75) Inventors: William Weber, East Providence, RI (US); Satoshi Mori, Tokyo (JP); Nao Honda, Saitama (JP)

(73) Assignees: MicroChem Corp., Newton, MA (US); Nippon Kayaku Co., Ltd., Tokyo (JP)

( * ) Notice: Subject to any disclaimer, the term of this patent is extended or adjusted under 35 U.S.C. 154(b) by 0 days.

(21) Appl. No.: 11/028,455

(22) Filed: Jan. 3, 2005

(65) Prior Publication Data

US 2005/0147918 A1    Jul. 7, 2005

(51) Int. Cl.
G03F 7/40 (2006.01)
(52) U.S. Cl. ................... 430/315; 430/280.1
(58) Field of Classification Search ............. 522/165
See application file for complete search history.

(56) References Cited

U.S. PATENT DOCUMENTS

| | | | |
|---|---|---|---|
| 4,229,265 A * | 10/1980 | Kenworthy | 205/50 |
| 4,354,895 A * | 10/1982 | Ellis | 430/315 |
| 4,882,245 A | 11/1989 | Gelorme et al. | 430/14 |
| 4,994,346 A | 2/1991 | Meier et al. | 430/280 |
| 5,079,129 A | 1/1992 | Roth et al. | 430/280 |
| 5,102,772 A | 4/1992 | Angelo et al. | 430/280 |
| 5,120,633 A | 6/1992 | Bauer et al. | 430/176 |
| 5,206,983 A | 5/1993 | Guckel et al. | 29/598 |
| 5,260,349 A | 11/1993 | Crivello | 522/31 |
| 5,264,325 A | 11/1993 | Allen et al. | 430/280 |
| 5,378,583 A | 1/1995 | Guckel et al. | 430/325 |
| 5,397,685 A | 3/1995 | Daniels et al. | 430/325 |
| 5,502,083 A | 3/1996 | Abe et al. | 522/31 |
| 5,554,664 A | 9/1996 | Lamanna et al. | 522/25 |
| 6,271,145 B1 | 8/2001 | Toda | |
| 6,280,090 B1 | 8/2001 | Stephens et al. | 384/284 |
| 6,368,769 B1 | 4/2002 | Ohkawa et al. | 430/270.1 |
| 6,454,393 B2 | 9/2002 | Chen et al. | |
| 6,558,871 B1 | 5/2003 | Takahashi et al. | 430/270.1 |
| 6,680,440 B1 | 1/2004 | Russell et al. | |
| 6,943,928 B1 | 9/2004 | Yasuda et al. | |

FOREIGN PATENT DOCUMENTS

| | | |
|---|---|---|
| CA | 2247777 | 3/1999 |
| CA | 2310700 A1 | 6/2001 |
| JP | 05-045880 | 2/1993 |
| JP | 05-204150 | 8/1993 |
| JP | 09-090609 | 4/1997 |
| JP | 10-97070 A * | 4/1998 |

OTHER PUBLICATIONS

Ullman's Encyclopedia of Industrial CHemistry, "Imaging Technology; 4. Imaging for Electronics" authors Steppen et al, posted online Mar. 15, 2003, 19 pages (Wiley-VCH Verlag GmBh&Co. KGaA.).*
English Machine translation of JP 10-097070 A and English abstract from Patent Abstracts of Japan (pp. 2 of 2 and pp. 1 of 1 and pp. 8 of 8) date of publicat of application: Apr. 14, 1998, Inventors. Yokoshima Minoru et al.*
AN 1998: 227545, from CAPLUS, copyrighs ACD on STN, English Abstract of JP 10-097070, 2 pages, Entered STN: Apr. 22, 1998.*
Englishi Translation by machine of JP 05-045880 A issued 1993, translation generated May 29, 2007 from the JPO and INPIT website by Examiner.*
English Translation by machine of JP 05-204150 A issued 1993, translation generated May 29, 2007 from the JPO and INPIT website by Examiner.*
English Translation by machine of JP 09-90609 A issued 1997, translation generated May 29, 2007 from the JPO and INPIT website by Examiner.*
"Year 2002", issued by Micromachine (Ltd.) Industrial Technology Service Center, 2002, 4 pgs. (No English Translation is available).
"The LIGA Process, High Polymers 43", Kobunshi, 1994, p. 564. (No English Translation is available).
"High Aspect Ratio Resist for Thick Film Applications", N. LaBianca and J.D. Gelorme, SPIE vol. 2438, pp. 846-852.
"Photoinitiated Cationic Polymerization with Triarylsulfonium Salts", J.V. Crivello and H.H.W. Lam, Journal of Polymer Science: Polymer Chemistry Edition, vol. 17, pp. 977-999, 1979.
"Negative Photoresists for Optical Lithography," J. M. Shaw, J. D. Gelorme, N. C. LaBiance, W. E. Conley, and S. J. Holmes, IBM Journal of Research and Development, vol. 141, pp. 81-94, 1997.

* cited by examiner

Primary Examiner—Cynthia Hamilton
(74) Attorney, Agent, or Firm—Todd E. Garabedian; Wiggin and Dana LLP

(57) ABSTRACT

Photoresist compositions that demonstrate superior photolithographic performance and hardened resist films that show superior resistance to solvents, have excellent resistance to under plating during the electrodeposition of metals, and show excellent resist stripping characteristics. These photoresist compositions according to the invention are well-suited as for applications in the manufacture of MEMS and micromachine devices. These photoresist compositions according to the invention comprise one or more epoxide-substituted, polycarboxylic acid Resin Component (A), one or more photoacid generator compounds (B), and one or more solvent (C).

28 Claims, No Drawings

PHOTORESIST COMPOSITIONS, HARDENED FORMS THEREOF, HARDENED PATTERNS THEREOF AND METAL PATTERNS FORMED USING THEM

BACKGROUND OF THE INVENTION

1. Field of the Invention

This invention relates to photoresist compositions, a hardened form thereof, and metal patterns therefrom that are suited for use in the fabrication of MEMS (micro-electromechanical system) components, micromachine components, microfluidic components, μ-TAS (micro total analysis system) components, ink-jet printer components, microreactor components, electroconductive layers, metallic bump connections, LIGA components, forms and stamps for microinjection molding and microembossing, screens or stencils for fine printing applications, MEMS and semiconductor packaging components, and printed wiring boards that can be processed by ultraviolet (UV) lithography.

2. Brief Description of Prior Art

Photoimageable coatings are currently used in a wide variety of semiconductor and micromachining applications. In such applications, photoimaging is accomplished by exposing the coating on a substrate to patterned radiation thereby inducing a solubility change in the coating such that the exposed or unexposed regions can be selectively removed by treatment with a suitable developer composition. The photoimageable coating (photoresist) may be either of the positive or negative type, where exposure to radiation either respectively increases or decreases the solubility in the developer. Advanced packaging applications requiring solder bumps with a high aspect ratio (defined as the height to width ratio of the imaged feature), or applications involving the fabrication of micro-electromechanical devices (MEMS) often require photoimageable compositions capable of producing uniform spin-coated films and high aspect ratio images with vertical sidewall profiles in films with a thickness greater than ten microns.

Devices in which micromechanical elements, electronic circuits including radiofrequency elements, and optical elements are assembled are called MEMS (micro-electromechanical systems) or micromachines. Many applications of these have been studied and they have been put into practical use. (see Year 2002, issued by Micromachine (Ltd.) Industrial Technology Service Center.) Although these devices, which are based on semiconductor technology, are small, they are complex and this name is generally given to devices having high-order function and represents the basic technology that constitutes important components that are keys to systems such as various types of sensors, printer heads, disk heads, communications light switches, and biochips.

Conventional positive photoresists based on diazonaphthaquinone-novolac chemistry are not well-suited to applications requiring film thicknesses greater than about 50 microns. This thickness limitation is caused by the relatively high optical absorbance of the diazonaphthaquinone-type (DNQ) photoactive compounds at wavelengths in the near-ultraviolet region of the optical spectrum (350–450 nm) which are typically used to expose the photoresist. Also, DNQ-type photoresists possess limited contrast, or differential solubility, of the exposed vs. unexposed photoresist in a developer solution which results in relief image sidewalls that are sloped rather than vertical. Optical absorption necessarily reduces the radiation intensity as it traverses from the top to the bottom of the film, such that if the optical absorption is too high, the bottom of the film will be underexposed relative to the top, causing a sloped or otherwise distorted profile of the developed image. Nevertheless, DNQ resist formulations are available for use at film thicknesses up to 100 microns, but at a great increase in the required exposure dose.

A negative, spin-coated, thick-film photoimageable composition of the chemically amplified type, which has a very low optical absorbance at wavelengths in the 350–450 nm range has been described in the literature [N. LaBianca and J. D. Gelorme, "High Aspect Ratio Resist for Thick Film Applications", Proc. SPIE, vol. 2438, p. 846 (1995)]. High aspect ratio (>10:1) photoimaging was demonstrated in 200 micron thick films. This resist comprises a solution in a casting solvent of a highly branched, octafunctional epoxy-novolac resin, EPON® SU-8 from Resolution Performance Products, and a photoacid generator (PAG) such as CYRACURE® UVI 6974 from Dow Chemical which consists of a mixture of arylsulfonium hexafluoroantimonate salts. The resulting photoresist formulation may be spin coated or curtain coated onto a wide variety of substrates, pre-baked to evaporate solvent, leaving a solid photoresist coating of one hundred microns or greater thickness which may be photoimaged by exposure to near-ultraviolet radiation through a patterned photomask using contact, proximity, or projection exposure methods. Subsequent immersion of the imaged layer in a developer solvent dissolves away the unexposed regions, leaving behind a high resolution, negative-tone relief image of the photomask in the film.

EPON® SU-8 resin is a low molecular weight epoxy-functional oligomer that has several characteristics making it advantageous for high aspect ratio photoimaging in thick films: (1) it has a high average epoxide functionality (eight), (2) a high degree of branching, (3) high transparency at wavelengths of 350–450 nm, and (4) the molecular weight is sufficiently low as to allow preparation of high solids coating compositions. The high functionality and branching result in efficient crosslinking under the influence of strong acid catalysts, while the high transparency allows uniform irradiation through thick films, making the resist capable of forming images with aspect ratio of greater than 10:1 at film thicknesses of greater than 100 microns. In fact, only high epoxy functionality and a high degree of branching will provide the high aspect ratio structures with straight sidewalls.

Suitable photoacid generators based on sulfonium or iodonium salts are well-known and have been extensively discussed in the literature [see for example, Crivello et al., "Photoinitiated Cationic Polymerization with Triarylsulfonium Salts", Journal of Polymer Science: Polymer Chemistry Edition, vol. 17, pp. 977–999 (1979).] Other useful PAGs with appropriate absorbance include the carbonyl-p-phenylene thioethers as described in U.S. Pat. Nos. 5,502,083 and 6,368,769. Additionally, sensitizers such as 2-alkyl-9,10-dimethoxyanthracenes or various naphthalene, peryl or pyryl compounds can be added to the formulation or incorporated into the PAG as described in U.S. Pat. No. 5,102,772. Negative photoresists based on the above disclosed compositions which are suitable for spin-coating are sold by MicroChem Corp., Newton, Mass., USA and are used commercially, especially in the fabrication of MEMS devices. For example, a product typically offered by MicroChem, "SU-8 50" can be spin-coated at 1000–3000 rpm to produce films of thickness in the range of 30–100 microns, which after exposure and solvent development, can produce images having an aspect ratio greater than 10:1 at film thicknesses greater than 100 microns. Higher or lower solids versions extend the film thickness range obtainable by a single coat process to less than 1 micron and above 200 microns. Casting of the solution can result in films of 1 to 2 mm or more in thickness. U.S. Pat. No. 4,882,245 also describes the application of these materials as a dry film photoresist when coated onto a carrier medium such as Mylar film.

A pattern-forming method based on X-ray lithography and which is called the "LIGA process," is frequently used in the process of manufacture of MEMS devices (Kobunshi, *High Polymers*, 43, p 564 (1994). "LIGA" is a German term and is the abbreviation of Lithographie (lithography) Galvanoformung (electrodeposition) Abformung (molding). This process comprises the application of X-ray photoresists such as PMMA photoresists, an X-ray irradiation process, a solvent development process, a metal plating process and a resist pattern removal or "stripping" process. An alkali developable plating resist in which X-ray lithography is used has been proposed as disclosed in Japanese Patent Application Early Disclosure No. 9-90609 [1997]).

The "LIGA" process, which uses X-ray lithography, has the drawbacks that an expensive X-ray device is necessary, that X-ray irradiation takes a long time, and that development time is long. Because the X-ray LIGA process cannot satisfy the demands for saving resources, increasing workability, and increasing productivity which have become topics of discussion in recent years, there has been the desire for a LIGA process using less expensive and high throughput ultraviolet lithography systems. Many plating resists for use in UV lithography have been developed for use in printed circuit boards. Because they have comparatively small aspect ratios, there has been demand for new photoresists having characteristics suited for MEMS and micromachine fabrication.

Photoresists as disclosed in Japanese Patent Application Early Disclosure No. 5-45880 [1993], Japanese Patent Application Early Disclosure No. 6-204,150 [1993] and Japanese Patent Application Early Disclosure No. 11–315, 384 [1999] are cited as photoresists for electroplating that can be processed by UV lithography.

While the SU-8 resin based compositions that have been disclosed are capable of very high resolution and aspect ratio, the cured resin has a tendency to be brittle, and often undergoes developer induced crazing/cracking, stress-induced cracking, has limited adhesion to certain substrates, and sometimes demonstrates delamination of the coating from the substrate. All these problems are exacerbated by the shrinkage induced stress that occurs when the material undergoes polymerization and is manifested in substrate bowing, where shrinkage of the coating induces bending (bowing) of the substrate. Further, SU-8 based photoresists must be developed with organic solvents or organic solvent mixtures and the imaged resists are so highly crosslinked after imaging that it is virtually impossible to remove the imaged photoresist with common strippers or other removal methods.

There have been many other prior art proposals for different photoimageable compositions including many that use epoxies. Examples of these can be found as referenced in U.S. Pat. No. 5,264,325. Here it is further taught that the photoresist material must be formulated such that it can be applied by coating methods, for example spin coating, which requires certain rheological properties. In addition, the composition must have the properties of providing sufficient transmission of the exposing radiation so as to photolyze the photoinitiator through the thickness of the film, and the photoresist must possess appropriate physical and chemical properties to withstand the application, such as electroplating or etch resistance, without significant degradation, or loss of adhesion.

Photoresist compositions that provide latent images that may be developed using aqueous solutions of organic and inorganic bases are of particular interest due to the interest in the electronics industry in using chemicals that more environmentally acceptable than organic solvents. U.S. Pat. Nos. 4,994,346, 5,079129, and 5,397,685 describe negative tone, epoxide containing, solder mask compositions that can be developed with aqueous base solutions. U.S. Pat. No. 5,120,633 describes photoresist compositions based on polymers bearing acid-labile protecting groups that are rendered soluble in aqueous base solution through the action of photochemically produced acids.

However, no specific type of epoxy resin has been found which will satisfy all of the various requirements; however many different combinations or mixtures of various epoxy resins have been disclosed. All of the noted patents describe various resins and photoinitiators for use in photocurable compositions, many of which are useful as photoimageable layers in permanent applications. However none of them teach or suggest the aqueous base developable, readily strippable compositions of the present invention nor are they suitable for the intended applications.

It is therefore desirable to provide a photoimageable formulation containing both epoxide groups and an aqueous alkaline soluble functionality in the same resin that may be cured with a photosensitive cationic initiator while retaining the good image resolution, high aspect ratio and straight sidewalls of SU-8 based photoresist formulations but at the same time allows the photoresist to be developed in a typical aqueous alkali based photoresist developer and allows the ready removal of the patterned photoresist after the post imaging processes have been carried out.

BRIEF SUMMARY OF THE INVENTION

This invention provides photoresists for plating and hardened forms thereof with which pattern forming is easily accomplished using ultraviolet lithography as a result of the fact that the photoresists contain an epoxy resin of a specified structure and a cationic photopolymerization initiator and have properties suited to MEMS, micromachines, bump interconnects, or other microelectronic plating and etching applications.

One aspect of the present invention is directed to a photoresist composition comprising: one or more cationically polymerizable Resin Components (A) bearing in their structures epoxide groups and carboxylic acid groups wherein Resin Component A is described by the following Formula 1;

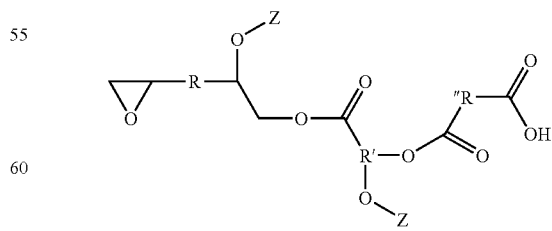

wherein Z is H or —COR"COOH; and wherein groups R, R', and R" are individually selected from the groups consisting of monomeric, oligomeric or polymeric organic bridging groups, with one or more photoacid generator compounds (B), and one or more solvents (C).

These bridging groups preferably include, but are not limited to, aliphatic, cycloaliphatic, aryl, polyaryl, alkyl-aryl, fused cycloaliphatic, fused aryl, and fused alkyl-aryl groups.

Another aspect of the present invention is directed to a dry film photoresist material made from this photoresist composition.

Still another aspect of the present invention is directed to a method of forming metal patterns from this photoresist composition.

DETAILED DESCRIPTION OF THE INVENTION

The photoresist compositions of the present invention are comprised of: one or more cationically polymerizable Resin Components (A) bearing in their structures epoxide groups and carboxylic acid groups; one or more photoacid generator compounds (B), and one or more solvents (C).

The Resin Component A has been specifically designed and optimized to provide the high aspect ratio, vertical side-wall structures, processability in aqueous developers, and ease of stripping required by current and emerging MEMS and microelectronic applications. According to the invention, Resin Component A contains both epoxide and carboxylic acid groups. The epoxide equivalent weight of Resin Component A may be from 100 g/eq to 1000 g/eq and the acid value, determined titrametrically, should be between 10 to 200 mg KOH/g. The epoxide groups bonded to Resin Component (A) may be polymerized by the action of a strong acid to yield a product that is insoluble in solvents in which the non-crosslinked material is soluble. The acid catalyzed or cationic polymerization of Resin Component (A) may be initiated by the strong acids produced by the reactions of photoacid generator compound (B) that are induced by absorption of radiant energy of suitable wavelength by the photoacid generator compound (B). By irradiating a dried film of the photoresist composition imagewise through a mask, an image of the mask may be transferred into the film. The presence of the correct amount of carboxylic acid groups in the resin imparts good solubility in aqueous, alkaline developing solutions to Resin Component (A). Because the crosslinked products of Resin Component (A) are not soluble in aqueous, alkaline developing solutions, this property provides a means for developing a negative tone, relief image in the resist by dissolving the unexposed material with an aqueous, alkaline developer solution. In addition, the crosslinked product of the composition is not soluble in selected organic solvents in which Resin Component (A) is soluble and this attribute provides, as an additional means for developing the relief image, the ability to develop the image in an organic solvent or organic solvent mixture.

The general method of preparation of Resin Component (A) is through the catalyzed or non-catalyzed reaction of a suitably selected Resin Component (I) containing at least two or more epoxide groups per molecule with a carboxylic acid compound (II) containing one carboxylic acid group and at least one hydroxyl group to provide a product resin (III) containing epoxide groups and hydroxyl groups. In a second reaction, the epoxide resin containing hydroxyl groups (III) is reacted with compound (IV) containing at least one cyclic, dibasic anhydride group to provide Resin Component (A) as the reaction product in solution. The general scheme for preparing Resin Component (A) is illustrated by the generic structures shown in Scheme 1.

Scheme 1. General method for the synthesis of Resin Component (A).

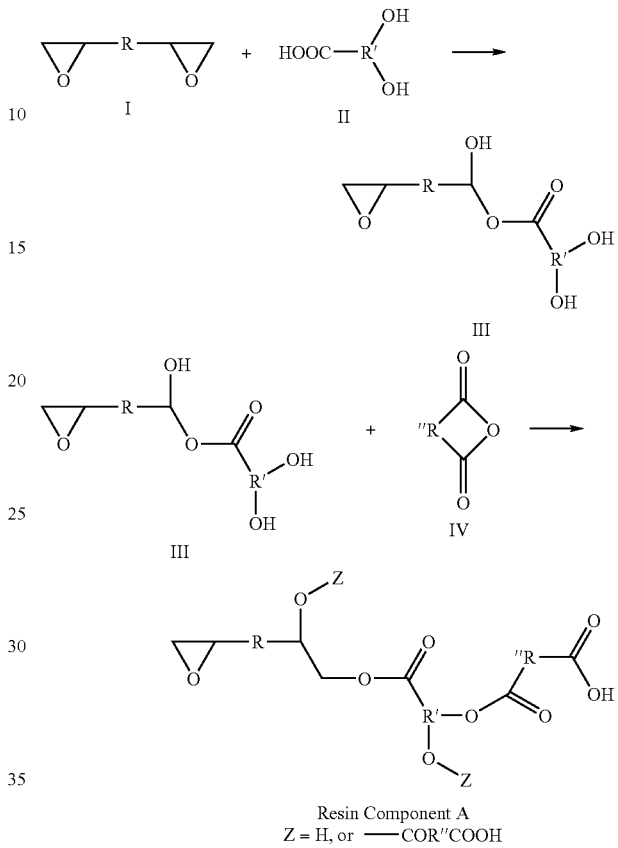

Resin Component A
Z = H, or ——COR″COOH

The groups R, R', and R″ shown in Scheme 1 are any suitable oligomeric or polymeric organic bridging group including, but not limited to, aliphatic, cycloaliphatic, aryl, polyaryl, alkyl-aryl, fused cycloaliphatic, fused aryl, and fused alkyl-aryl. The epoxy groups contained in Resin Component (I) may be bound to repeating structural units along the length of a polymeric chain and may occur as terminal groups.

Specific examples of Resin Component (I) having at least two or more epoxy groups in one molecule that can be used in this invention include the general group comprising epoxy-novolac resins. Epoxy-novolac resins are prepared by reaction of a novolac resin with epichlorohydrin and/or methyl epichlorohydrin. Commercial examples of epoxy-novolac resins include EOCN-103, EOCN-104S, EOCN-102, EOCN-1027, EOCN-4400H, EPPN-201 and BREN-S, manufactured by Nippon Kayaku, Ltd., Tokyo, Japan; DEN-431 and DEN 439, manufactured by the Dow Chemical Company, Midland, Mich., USA; and N-730, N-770, N-865, N-665, N-673 and VH-4150, manufactured by Dainippon Ink and Chemicals Ltd., Tokyo, Japan. Yet another specific example of Resin Component (I) are the general group comprising bisphenol epoxy resins prepared by the polycondensation of bisphenols such as bisphenol A, bisphenol F, bisphenol S, and tetrabromobisphenol A with epichlorohydrin and/or methyl epichlorohydrin or the substances obtained by reacting the polycondensates of the diglycidyl ethers of bisphenol A or bisphenol F and the aforementioned bisphenols with epichlorohydrin and/or methyl epichlorohydrin. Commercial examples of the bisphenol epoxy resins that may be used as Resin Component (I) include Epicote 1004, Epicote 1002, Epicote 4002 and Epicote 4004, manufactured by Japan Epoxy Resin, Co., Ltd., Tokyo, Japan. Another specific example of Resin Component (I) are the general group comprising the tris-phenolmethane epoxy resins prepared by reacting tris-phenolmethane or tris-cresolmethane with epichlorohydrin and/or methyl epichlorohydrin, Commercial examples of the tris-phenolmethane epoxy resin group include EPPN-501 and EPPN-502, manufactured by Nippon Kayaku Ltd., Tokyo, Japan; tris-(2,3-epoxypropyl) isocyanurate manufactured by Nissan Chemical Co., Ltd., Tokyo, Japan, biphenyl diglycidyl ether manufactured by Japan Epoxy Resin, Co., Ltd., Tokyo, Japan, Celoxide 2021 and EHPE3150, manufactured by Daicel Chemicals Industries Ltd., Tokyo, Japan; Other examples of epoxy resins suitable for use as Resin Component (I) include: Epomik VG-3101, manufactured by Mitsui Petrochemical Industries Ltd., Tokyo, Japan); E-1031S (belong to Resin Component(I), manufactured by Japan Epoxy Resin, Co., Ltd., Tokyo, Japan., Tokyo, Japan;, alicyclic epoxy resins such as EPB-13 and EPB-27, manufactured by Nippon Soda, Ltd., Tokyo, Japan), copolymer epoxy resins, including for example, CP-50M, CP-50S, manufactured by Nippon Oils and Fats, Ltd., Tokyo, Japan, which are copolymers of glycidyl methacrylate, styrene and methylstyrene, or copolymers of glycidyl methacrylate and cyclohexyl maleimide, and epoxy resins having special structures. Epoxy resins that are particularly desirable for use as Resin Component (I) are the epoxy cresol-novolac resins and the epoxy phenol-novolac resins.

Next and according to Scheme I, examples of the aforementioned Compound (II) having at least one hydroxyl group and one carboxyl group in one molecule that can be used in this invention include monocarboxylic acids containing two hydroxyl groups and dimethylol propionic acid, dimethylol acetic acid, dimethylol butyric acid, dimethylol valeric acid and dimethylol caproic acid may be cited as specific examples. Yet another example of substances useful as Compound (II) are monocarboxylic acids having one hydroxyl group and hydroxypivalic acid and p-hydroxybenzoic acid may be cited as specific examples. The substances corresponding to Compound (II) may be used singly or in mixtures of two or more. Dimethyol propionic acid is particularly preferred for use as Compound (II).

In the reaction between Resin Component (I) and Compound (II), there should be 0.01 to 0.5 mol, and, preferably, 0.1 to 0.3 mol, of carboxylic acid groups per equivalent weight of Resin Component (I) epoxide groups. The equivalent weight of epoxide groups also referred to herein as epoxide equivalent weight or EEW, is determined using titerometric methods and has units of grams resin per mole of epoxide wherein the molecular weight of the epoxy group is 43 atomic mass units.

Organic solvents may be used to dissolve the reactants during the preparation of Resin Component (A) and to adjust the solids content and viscosity of the Resin Component (A) solution after the reaction has been completed. Solvents that are suitable for this purpose include ketones, such as methyl ethyl ketone, cyclopentanone, and cyclohexanone; ethers, such as tetrahydrofuran, 1,3-dioxolane, and 1,4-dioxane; glycol ethers, such as dipropylene glycol dimethyl ether, dipropylene glycol diethyl ether; esters, such as ethyl acetate, butyl acetate, butyl cellosolve acetate, and carbitol acetate; aromatic hydrocarbons, such as toluene, xylene and tetramethylbenzene; aliphatic hydrocarbons, such as octane and decane; and petroleum solvents, such as petroleum ether, petroleum naphtha, hydrogenated petroleum naphtha and solvent naphtha. These solvents may be used singly or in mixtures of two or more depending on the needs of the application and the solubility of the particular reactants. These reaction solvents may be all or part of the solvent component (C) of the present invention. The preferred solvents do not precipitate Resin Component (A) or otherwise cause difficulties in operating the invention.

Catalysts may be used to promote the reaction of Resin Component (I) with Compound (II). Examples of suitable catalysts include triphenylphosphine, benzyldimethylamine, methyltriethylammonium chloride, triphenyl stybin, and chromium octanoate. The quantity of catalyst used should be 0.1 to 10 weight percent relative to the reaction mixture of raw materials. The reaction temperature should be 60 to 150° C. and the reaction time should be 5 to 30 hours. For certain embodiments of the invention it may be preferable to essentially deactivate the activity of the catalyst after the reaction has been completed by subjecting the catalyst that was used to an oxidation treatment by adding organic peroxide. Examples of organic peroxides that may be used to deactivate the catalyst include tetramethyl butyl hydroperoxide, cumene hydroperoxide, and tert-butyl hydroperoxide. Tert-butyl hydroperoxide is particularly preferred as the oxidant for catalyst deactivation.

Examples of the dibasic acid anhydride suitable for use as Compound (IV) in Scheme 1 and that may be reacted with reaction product III include, succinic anhydride, maleic anhydride, phthalic anhydride, tetrahydrophthalic anhydride, hexahydrophthalic anhydride, methyl hexahydrophthalic anhydride, cis,endo-norbornane dicarboxylic acid anhydride, cis, endo-norbornene dicarboxylic acid anhydride, methyl endomethylene tetrahydrophthalic anhydride, and trimellitic acid, The dibasic acid anhydride (IV) should be reacted in an amount of 0.1 to 1.0 equivalent of acid per equivalent of hydroxyl groups relative to the hydroxyl groups in the aforementioned reaction product (II) wherein the content of hydroxyl groups is determined by calculation. The reaction temperature should be 60 to 150° C. and the reaction time should be 1 to 10 hours.

Compounds that generate a protic acid when irradiated by active rays, such as ultraviolet rays, and the like, are preferred as the photoacid generator compounds (B) used in the present invention. Aromatic iodonium complex salts and aromatic sulfonium complex salts are cited as examples. Di-(t-butylphenyl)iodonium triflate, diphenyliodonium tetrakis(pentafluorophenyl)borate, diphenyliodonium hexafluorophosphate, diphenyliodonium hexafluoroantimonate, di(4-nonylphenyl)iodonium hexafluorophosphate, [4-(octyloxy)phenyl]phenyliodonium hexafluoroantimonate, and the like are cited as specific examples of the aromatic iodonium complex salts that can be used. Moreover, triphenylsulfonium triflate, triphenylsulfonium hexafluorophosphate, triphenylsulfonium hexafluoroantimonate, triphenylsulfonium tetrakis(pentafluorophenyl)borate, 4,4'-bis[diphenylsulfonium]diphenylsulfide bis-hexafluorophosphate, 4,4'-bis[di(β-hydroxyethoxy)phenylsulfonium]diphenylsulfide bis-hexafluoroantimonate, 4,4'-bis[di(beta-hydroxyethoxy)(phenylsulfonium)diphenyl sulfide-bishexafluorophosphate 7-[di(p-tolyl)sulfonium]-2-isopropylthioxanthone hexafluorophosphate, 7-[di(p-tolyl)sulfonio-2-isopropylthioxanthone hexafluoroantimonate, 7-[di(p-tolyl)sulfonium]-2-isopropyl tetrakis(pentafluorophenyl)borate, phenylcarbonyl-4'-diphenylsulfonium diphenylsulfide hexafluorophosphate, phenylcarbonyl-4'-diphenylsulfonium diphenylsulfide hexafluoroantimonate, 4-tert-butylphenylcarbonyl-4'-diphenylsulfonium diphenylsulfide hexafluorophosphate, 4-tert-butylphenylcarbonyl-4'-diphenylsulfonium diphenylsulfide hexafluoroantimonate, 4-tert-butylphenylcarbonyl-4'-diphenylsulfonium diphenylsulfide tetrakis(pentafluorophenyl)borate, diphenyl [4-(phenylthio)phenyl]sulfonium hexafluoroantimonate and the like can be cited as specific examples of the aromatic sulfonium complex salt that can be used. Certain ferrocene compounds such as Irgacure 261 (Ciba Specialty Chemicals) may also be used. These photoacid generator compounds (B) may be used alone or as mixtures of two or more compounds. Additional examples of photoacid generator compounds (B) suitable for use in the present invention are described in U.S. Pat. Nos. 6,558,871, 5,260,349, and 5,554,664 and references cited therein.

The solvent component (C) of the invention may be the same solvent that may be used in the preparation of Resin Component (A). Examples of solvent (C) that may be added to Resin Component (A) include purpose include ketones, such as methyl ethyl ketone, cyclopentanone, and cyclohexanone; ethers, such as tetrahydrofuran, 1,3-dioxolane, and 1,4-dioxane; glycol ethers, such as dipropylene glycol dimethyl ether dipropylene, glycol diethyl ether; esters, such as ethyl acetate, butyl acetate, butyl cellosolve acetate, and carbitol acetate; aromatic hydrocarbons, such as toluene, xylene and tetramethylbenzene; aliphatic hydrocarbons, such as octane and decane; and petroleum solvents, such as petroleum ether, petroleum naphtha, hydrogenated petroleum naphtha and solvent naphtha. These solvents may be used singly or in mixtures of two or more depending on the needs of the application and the solubility of the particular components of the composition. In addition, one or more solvents (C) may be added to the solution of Resin Component (A) other than the solvent present from the preparation of Resin Component (A) thereby providing a composition containing two or more solvents selected from the recited examples of solvent (C). Preferred solvents that may be added to Resin Component (A) to provide compositions according to the invention are solvents that do not precipitate components of the composition or otherwise interfere with the operation of the invention.

Optionally, one or more reactive monomers (D) can be used in this invention. Inclusion of reactive monomers in the composition may improve the operation of the invention in certain embodiments by increasing the extent of composition crosslinking or by providing more flexible films. The reactive monomers useful in the invention include compounds with two or more epoxy groups or other functional groups capable of cationic polymerization or cross linking. Difunctional and polyfunctional glycidyl ethers are examples of reactive monomers (D) and diethylene glycol diglycidyl ether, propylene glycol diglycidyl ether, polypropylene glycol diglycidyl ether, hexanediol diglycidyl ether, trimethylolpropane triglycidyl ether, pentaerythritol tetraglycidyl ether, and the like are cited as examples. These glycidyl ethers (D) can be used individually or in mixtures of two or more. Alicyclic epoxy compounds can also be used as reactive monomer (D) in this invention and 3,4-epoxycyclohexylmethyl methacrylate and 3,4-epoxycyclohexylmethyl-3',4'-epoxycyclohexane carboxylate may be cited as examples. Monofunctional and/or polyfunctional aliphatic and aromatic oxetane compounds are yet another example of reactive monomer (D) that can be used in the invention. Specific examples of the monofunctional and/or polyfunctional oxetane compounds that can be used in this invention include 3-ethyl-3-hydroxymethyl oxetane, 3-ethyl-phenoxymethyl oxetane, xylylene dioxetane and bis-(3-ethyl-3-oxetanylmethyl) ether. It should be further understood that any combination of the compounds cited as examples of reactive monomer (D) can be used as mixtures of two or more.

Proper functioning of the invention requires absorption of ultraviolet rays by the photoinitiator and an optional photosensitizer compound (E) may be used for the purpose of increasing the amount of acid produced by photoacid generator compound (B) than would be produced at a given energy dose in the absence of the sensitizer. The photosensitizer (E) compounds that may be used in the invention include anthracene compounds having alkoxy groups at positions 9 and 10 of the anthracene ring. The alkoxy group can be, for example, a $C_1$–$C_4$ alkoxy group such as a methoxy group, an ethoxy group or a propoxy group. The 9,10-dialkoxyanthracene derivative may further have substituent groups. The substituent groups can be, for example, halogen atoms such as fluorine, chlorine, bromine and iodine, $C_1$–$C_4$ alkyl groups such as methyl, ethyl, and propyl groups, sulfonic acid groups, sulfonate ester groups, and carboxylic acid alkyl ester groups. The alkyl groups in the sulfonic acid alkyl ester groups and carboxylic acid alkyl ester groups can be, for example, methyl, ethyl and propyl groups. The preferred substitution position of the substituents groups is at the 2 position of the anthracene ring system. Specific examples of 9,10-dialkoxyanthracene derivatives that can be used in this invention can include, for example, 9,10-dimethoxyanthracene, 9,10-diethoxyanthracene, 9,10-dipropoxyanthracene, 9,10-dimethoxy-2-ethylanthracene, 9,10-diethoxy-2-ethylanthracene, 9,10-dipropoxy-2-ethylanthracene, 9,10-dimethoxy-2-chloroanthracene, 9,10-dimethoxyanthracene 2-sulfonic acid, 9,10-dimethoxyanthracene-2-sulfonic acid methyl ester, 9,10-diethoxyanthracene-2-sulfonic acid methyl ester and 9,10-dimethoxyanthracene-2-carboxylic acid methyl ester.

In this invention, an optional dye compounds (F), which exhibits absorption at 365 nm of greater than 15/cm·g/L, can be used to control the shape of the pattern that is formed to an inverse tapered shape. Specific examples of compound (F) that can be used in this invention include, for example; benzophenone compounds such as 2,4-dihydroxybenzophenone and 2,2',4,4'-tetrahyxroxybenzophenone; salicylic acid compounds such as phenyl salicylate and 4-t-butylphenyl salicylate; phenyl acrylate compounds such as ethyl-2-cyano-3-,3-diphenylacrylate and 2'-ethylhexyl-2-cyano-3,3-diphenylacrylate; benzotriazole compounds such as 2-(2-hydroxy-5-methylphenyl)-2H-benzotriazole and 2-(3-t-butyl-2-hydroxy-5-methylphenyl)-5-chloro-2H-benzotriazole; coumarin compounds such as 4-methyl-7-diethylamino-1-coumarin; azo dyes such as Sudan Orange, thioxanthone compounds such as diethyl thioxanthone as well as stilbene compounds and naphthalic acid compounds. These dye compounds (F) can be used individually or as mixtures of two or more compounds.

In this invention, an optional dissolution rate control agent (G) can be used to modify the rate in which the photoresist film dissolves in a developer solution. Examples of dissolution control agents that can be used include compounds that contain phenolic hydroxyl groups such as phenol, substituted phenols, bisphenols, bisphenol-novolac resins, poly(hydroxystyrene), ether and ester derivatives of any of the aforementioned compounds containing phenolic groups, and copolymers of hydroxystyrene with acrylic and methacrylic acids and esters. Yet other examples of dissolution control agents are copolymers of acrylic and methacrylic acid with acrylic and methacrylic acids and esters.

The content of photoacid generator compound (B) may be 0.10 weight % to 10 weight %, and, preferably, 1.0 weight % to 7.5 weight %, relative to the total solid components, taking as the solid component the total amount of Resin Component (A), photoacid generator compound (B), reactive monomer (D), photosensitizer component (E), dye component (F), and any other optional solid compounds, resins, or additives. If used, the content of reactive monomer (D) may be, per 100 parts by weight of Resin Component (A), 0.1 to 80 parts by weight, and preferably, 0.5 to 50 parts by weight. If used, the content of photosensitizer component (E) may be 0.1 to 6, and, preferably, 0.2 to 4, as a molar ratio relative to photoacid generator component (B). If used, the content of dye component (F) may be 0.01 weight % to 10 weight %, and, preferably, 0.1 weight % to 5 weight %, relative to the total content of components A, B, D, and E. The amount of solvent (C) may be from 1 to 99 weight %, and, preferably, 10 to 90 weight %, relative to the total photoresist composition. If used, the content of dissolution rate control agent (G) may be from 0.5 to 50 weight % of the amount of the Resin Component (A).

Other optional ingredients may be added to the composition of the present invention. For example, one or more epoxy resins from the group comprising any of the Resin Component (I) epoxy resins, bisphenol A epoxy resins, bisphenol A-formaldehyde novolac epoxy resins, phenol-novolac epoxy resins, cresol-novolac epoxy resins, and trisphenolmethane epoxy resins and/or one or more methacrylate compounds selected from the group comprising pentaerythritol tetramethacrylate and dipentaerythritol penta- and hexamethacrylate, and methacrylate oligomers such as epoxy methacrylates, urethane methacrylates and polyester poly(methacrylates) may be used. The quantity of these optional ingredients that may be used is from 0 to 50 parts by weight per 100 parts by weight of the total of Resin Component (A) and reactive monomer (D).

Additional optional ingredients that may be added to the composition of the present invention include one or more inorganic fillers selected from the group comprising barium sulfate, barium titanate, silicon oxide, amorphous silica, talc, clay, magnesium carbonate, calcium carbonate, aluminum oxide, aluminum oxide, and mica powder. The content ratio of filler material may be from 0.1 to 60 weight % of the total weight of Resin Component (A), photoacid generator compound (B), solvent (C), and the sum of optional components (D), (E), and (F).

Moreover and as required, various other optional additives such as crosslinking agents, thermoplastic resins, colorants, thickeners, surface leveling agents, defoaming agents, and adhesion promoting agents can be used in this invention. Crosslinking agents can include, for example, methoxylated melamine, butoxylated melamine, and alkoxylated glycouril compound. Cymel® 303 from Cytec Industries, West Patterson, N.J., is a specific example of a suitable methoxylated melamine compound. Powderlink® is a specific example of an alkoxylated glycouril compound. Thermoplastic resins can include, for example, polyether sulfones, polystyrenes and polycarbonates. Colorants can include, for example, phthalocyanine blue, phthalocyanine green, iodine green, crystal violet, titanium oxide, carbon black and naphthalene black. Thickeners can include, for example, orben, benton, and montmorillonite. Suitable surface leveling agents include fluoroaliphatic esters such as FC 171, FC 430, or FC 4430 (3M Company), hydroxyl terminated fluorinated polyethers such as PolyFox PF-636 and PF-5620 (Omnova Solutions), silicones such as Baysilone 3739 (Bayer), fluorinated ethylene glycol polymers such as Fluor N-561 and 562 (Cytonix Corporation), acrylic polymer leveling agents such as Modaflow (Surface Specialties, Inc.) and the like. Defoaming agents can include, for example, silicon and/or fluorine containing defoaming agents. Adhesion promoting agents can include, for example, various types of leveling agents and silane coupling agents. Although 0.5 to 30 weight % is the provisional standard, the quantity of optional additives can be adjusted depending on the appropriate objective of use.

The photoresist compositions of the present invention can be prepared by compounding together components (A), (B), and (C) and optional components (D) though (G) and when necessary, inorganic filler and other additives, preferably according to the above-mentioned ratios, and mixing them uniformly to provide the photoresist composition as a solution or dispersion. Compounding may be done using sealed containers mixed on rolling mills or in mixing tanks equipped with mechanical mixers, or similar devices known in the compounding art. It is particularly preferred that the resist compositions according to the invention are diluted with solvent component (C) to adjust the viscosity of the composition to a value appropriate to the intended use of the composition.

In order to use the photoresist compositions according to the invention, a coating of the composition is applied to a substrate at a thickness ranging from 100 nm to 1000 µm. The coated substrate is then heated at 60 to 140° C. for 5 to 60 minutes to remove the solvent and provide a substantially dry coating on the substrate. The dried coating is then irradiated image-wise through a mask with active radiation at a dose of 10 to 30,000 mJ/cm$^2$ to provide a pattern in the coating. A heat treatment step, also known in the art as a post exposure bake, is then performed for 3 to 30 minutes at 50 to 150° C., after which the portion not exposed to light is dissolved by treating the coated substrate for 1 to 30 minutes with a developing solution. The developed image may be rinsed with a suitable rinse solution to remove residual developer. As may be required in certain embodiments and to harden the patterned layer, the patterned resist layer is heat-treated for 1 to 60 minutes at 100 to 200° C. and then electrolytic or non-electrolytic plating of copper, nickel, gold or solder is effected. Following platting, the resist pattern is removed from the substrate using a stripping solution, by which means a metal pattern that satisfies various requirements of the intended application is obtained on the substrate.

When using the resist compositions of the present invention, the photoresist solution may be applied to a substrate by spin-coating, consisting of dispensing the liquid resist onto a substrate, accelerating the substrate to a constant rotational speed, and holding the rotation speed constant to achieve the desired coating thickness. Spin-coating may be performed with variable rotational velocity in order to control the thickness of the final coating. Other coating methods may be used including dip coating, spray coating, curtain coating, gravure coating, extrusion coating, slot coating, wire rod coating, and other methods know in the art of applying solvent borne coatings to substrates. Spin coating, slot coating, and gravure coating are preferred coating methods and spin coating is the most preferred coating method.

Substrate materials that can be used include, but are not limited to, silicon, silicon dioxide, silicon nitride, alumina, glass, glass-ceramics, gallium arsenide, indium phosphide, copper, aluminum, nickel, iron, steel, copper-silicon alloys, indium-tin oxide coated glass, printed wiring boards, organic films such as polyimide and polyester, any substrate bearing patterned areas of metal, semiconductor, and insulating materials, and the like. No special pre-treatment of the substrate is necessary for operation of the invention. Optionally, a bake step may be performed on the substrate to remove absorbed moisture prior to applying the resist coating. Where electroplating will be used, the substrate may be coated with a conductive layer prior to coating the photoresist composition.

Suitable active rays for irradiating the photoresist layers according to the invention are ultraviolet (UV) ray, X-rays, and electron beam radiation. Ultraviolet and X-rays are the preferred active rays and ultraviolet rays emitted from mercury-arc lamps at wavelengths of 365, 405, and 436 nm are the most preferred active rays. Suitable optical filters may be used to provide single wavelength illumination through the mask. Photolithography exposure equipment that that may be used includes contact, proximity, projection, and step and repeat tools.

Because Resin Component (A) of the compositions according to the invention contains carboxylic acid groups the unexposed and hence, non-cross linked, regions of the photoresist film are soluble in aqueous alkaline solutions and consequently, negative relief images may be formed by developing the image using aqueous alkaline developing solutions.

The aqueous alkaline developing solutions suitable for use in the invention may be selected from a group consisting of 0.5 to 5% by weight aqueous solutions of a substance providing an alkaline solution and these substances may be, for example, tetramethylammonium hydroxide, sodium or potassium carbonate, sodium or potassium metasilicate, or sodium or potassium hydroxide. The aqueous alkaline developing solutions may further comprise additives including surfactants and water miscible organic compounds such as alcohols, amines, and alkanol amines. Aqueous solutions of tetramethylammonium hydroxide are particularly preferred.

Because Resin Component (A) of the compositions according to the invention contains epoxy groups and because these epoxy groups are cationically polymerized during the exposure and post exposure bake steps, the exposed regions of the photoresist film are insoluble in many organic solvents while the unexposed and hence, non-cross linked, regions of the film are soluble in organic solvents. Consequently, negative relief images may be formed by developing the image using developing solutions comprising one or more organic solvents.

Developing solutions comprising one or more organic solvents suitable for use in the invention may contain one or more solvents selected from, but not limited to, the group comprising, propylene glycol methyl ether acetate, gamma-butyrolactone, acetone, cyclopentanone, diacetone alcohol, tetrahydrofurfuryl alcohol, 1-methyl-2-pyrrolidinone, anisole, and ethyl lactate. The developer solvents can be used singly or as mixtures. Propylene glycol methyl ether acetate is particularly preferred as an organic solvent developer because of its good solvency for the unexposed resist components and because of its relatively low cost.

The developer solvent may be applied by immersing the coated substrate in developer with agitation or by spraying using either an atomizing spray nozzle or fine shower-head type spray nozzle. Yet another method of developing the image comprises applying the developer using what is known in the photoresist art as a puddle process wherein the substrate to be developed is placed on a rotating tool head and then an amount of developer sufficient to form a standing layer or puddle on the entire substrate area is dispensed onto the substrate and allowed to stand for a defined period of time. After this time, the substrate is rotationally accelerated to spin off the spent developer and then decelerated until rotation stops. This sequence is repeated until a clear relief image is obtained and it is common to use a process wherein two to four solvent puddles are formed.

When used, suitable rinse solvents include water, methanol, ethanol, isopropanol, and water alcohol mixtures. Water is the preferred rinse solvent when aqueous alkaline developing solutions are used and isopropanol is the preferred rinse solvent when organic solvent developing solutions are used.

Stripping solvents and solutions suitable for use with the invention include 1-methyl-2-pyrrolidinone, dimethyl sulfoxide, dimethyl acetamide, dimethyl formamide, mixtures of 1-methyl-2-pyrrolidinone with one or more additional organic solvents, mixtures of 1-methyl-2-pyrrolidinone and dimethyl sulfoxide, mixtures of 1-methyl-2-pyrrolidinone and/or dimethyl sulfoxide with alkanolamines such as ethanolamine, diethanol amine and the like, and solutions of sodium hydroxide, potassium hydroxide, or tetramethylammonium hydroxide in 1-methyl-2-pyrrolidinone and/or dimethyl sulfoxide. Mixtures of 1-methyl-2-pyrrolidinone and dimethyl sulfoxide are preferred stripping solvents.

The resolution of the relief pattern may be described by the aspect ratio of an image feature. The aspect ratio is defined herein as the width of the image feature divided by the thickness of the photoresist film in which the feature is formed. According to the invention, the aspect ratio should be 1 to 100 and preferably, 2 to 50.

The resist compositions of the present invention can be used to manufacture dry film photoresists. To prepare a dry film photoresist, a resist composition according to the present invention is applied to a base film material using coating methods such as roller coating, doctor bar coating, slot coating, dip coating, spin coating, gravure coating, and the like. The coated base film is then dried in a drying oven set at 60 to 160° C. for a time sufficient to remove the desired amount of solvent. A cover film is then applied to the resist side of the coated film to protect the film from damage and to prevent sheets of coated material from sticking together. The thickness of the resist on the base film may be adjusted to 10 to 500 µm by suitable selection of solvents, resist solids content and coating parameters. Organic polymer film materials such as polyethylene terephthalate, polypropylene, and polyimide can be used as the base film. Organic polymers such as polyethylene and polypropylene can be used as the cover sheet material.

The dry film photoresist is used by first peeling the protective cover sheet from the resist layer, placing the dry film on a substrate with the resist side in contact with the substrate, laminating the resist to the substrate by application of heat and pressure using a lamination device and then peeling the base film from the resist. These operations result in forming a photoresist layer on the substrate which may be subsequently image wise processed image-wise using the methods described herein.

The hardened forms of the resin compositions of this invention obtained by the method described above are used as non-permanent resists for components such as MEMS or micromachines.

For example, the photoresist compositions and the metal patterns formed using them can be used to make components for micromachines as described in Japanese Patent Application Early Disclosure No. 2000-343,463, orifice components for ink-jet heads as described in Japanese Patent Application Early Disclosure No. 2001–10,068, components of magnetic actuators (MEMS) as described in Japanese Patent Application Early Disclosure No. 2001-71,299, components of microchips for electrophoretic coupling (β-TAS) as described in Japanese Patent Application Early Disclosure No. 2001–157,855, and, in addition, for microreactor components, electroconductive layers and metallic bump interconnects.

The photoresist compositions of the invention may be used as part of a LIGA process as described in U.S. Pat. Nos. 5,206,983, 5378,583, and 6,280,090, Canadian Patent 2,247, 777, and in Shaw, et.al., "Negative Photoresists for Optical Lithography", IBM Journal of Research and Development, vol. 41, 1997.

of tert-butyl hydroperoxide was added and the reaction was continued for approximately 1 hour. Triphenylphosphine, which was the reaction catalyst, was oxidized and its catalytic activity was deactivated.

Next, 492 g (3.2 mol) of tetrahydrophthalic anhydride and 211 g of cyclopentanone were charged and the reaction was carried out for 5 hours at 90° C. to yield Resin Solution A-1. The epoxide equivalent weight of the product on a solids basis was 305 g/eq and the acid value was 70 mg KOH/g.

The reaction product according to Synthesis Example 1 is believed to have the structure shown in Formula 1A wherein x+y is a real number ranging from 1 to 20, x is real number ranging from 0 to 10, and y is a real number ranging from 1 to 10.

Formula 1A. Structure of product from Synthesis Example 1.

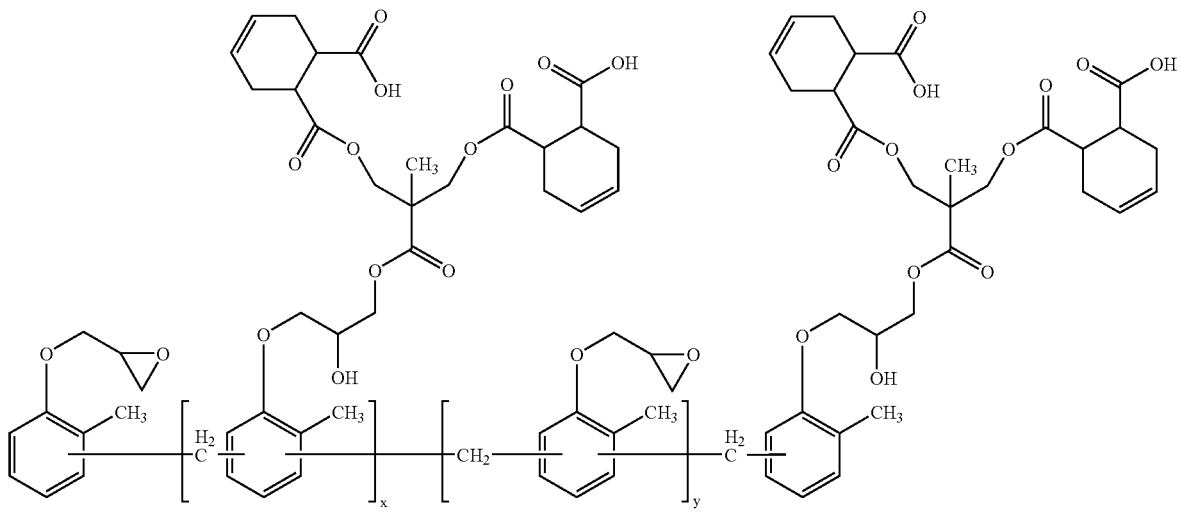

The present invention is further described in detail by means of the following Examples and Comparisons. All parts and percentages are by weight and all temperatures are degrees Celsius unless explicitly stated otherwise.

EXAMPLES

Examples of Synthesis of Resin Component (A) Containing Carboxylic Acid and Epoxy Groups Synthesis Example 1

Preparation of Resin Solution A-1

Cresol novolac epoxy resin, EOCN-4400H, manufactured by Nippon Kayaku, Ltd., Tokyo Japan, (softening point, 60° C.; epoxide equivalent weight 190 g/eq) 1900 g (10 equivalents), 201 g (1.5 mol) of dimethylol propionic acid, and 900 g of cyclopentanone were charged into a resin flask and the resulting mixture was heated at 90° C. with mechanical stirring until the reaction mixture was dissolved. Next, the reaction solution was cooled to 60° C. and 9.0 g (0.03 mol) of triphenylphosphine was added. The temperature of the reaction solution was increased to 100° C. and the reaction was carried out for approximately 5 hours until the titerometric acid value was less than 0.5 mg KOH/g. Next, the reaction mixture was cooled to 50° C. and 2.7 g (0.03 mol)

With reference to the radicals R, R', and R" shown in Scheme 1, the product of Synthesis Example 1 (Formula 1A) has the radical structures:

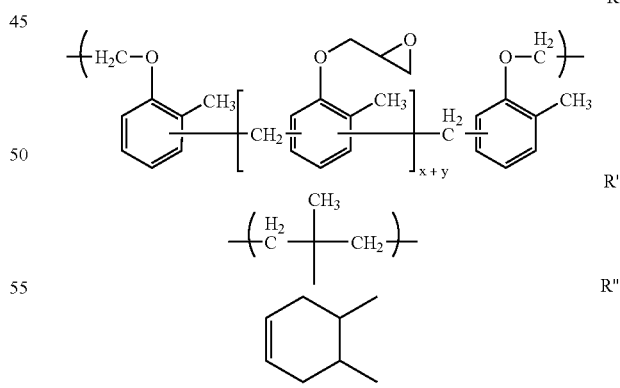

Synthesis Example 2

Preparation of Resin Solution A-2

Cresol novolac epoxy resin EOCN-4400H, manufactured by Nippon Kayaku, Ltd., Tokyo, Japan, (softening point, 60°

C.; epoxide equivalent weight 190 g/eq) 1900 g (10 equivalents), 201 g (1.5 mol) of dimethylol propionic acid, and 900 g of cyclopentanone (1.5 mol) were charged into a resin flask and the resulting mixture was heated at 90° C. with mechanical stirring until the reaction mixture was dissolved. Next, the reaction solution was cooled to 60° C. and 9.0 g (0.03 mol) of triphenylphosphine was added. The temperature of the reaction solution was increased to 100° C. and the reaction was carried out for approximately 5 hours until the titerometric acid value was less than 0.5 mg KOH/g. Next, the mixture was cooled to 50° C., and 2.7 g (0.03 mol) of tert-butyl hydroperoxide was added and the reaction was continued for approximately 1 hour. Triphenylphosphine, which is the reaction catalyst, was oxidized and its catalytic activity was deactivated.

Next, 450 g (3.0 mol) of tetrahydrophthalic anhydride and 193 g of cyclopentanone were charged and the reaction was carried out for 5 hours at 90° C. to yield Resin Solution A-2. The epoxide equivalent weight of the product resin was 300 g/eq and the acid value was 65 mg KOH/g.

The reaction product according to Synthesis Example 2 is believed to have the structure shown in Formula 1B wherein x+y is a real number ranging from 1 to 20, x is a real number ranging from 0 to 10, and y is a real number ranging from 1 to 10.

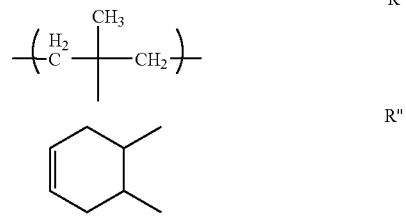

Synthesis Example 3

Preparation of Resin Solution A-3

Cresol novolac epoxy resin, EOCN-4400H, manufactured by Nippon Kayaku Ltd. Tokyo, Japan, (softening point, 60° C.; epoxide equivalent weight 190 eq/g) 1900 g (10 equivalents), 134 g (1.0 mol) of dimethylol propionic acid and 872 g of cyclopentanone were charged into a resin flask and the resulting mixture was heated 90° C. with mechanical stirring until the reaction mixture was dissolved. Next, the reaction solution was cooled to 60° C., 9.0 g (0.03 mol) of triph- Formula 1B. Structure of product from Synthesis Example 2.

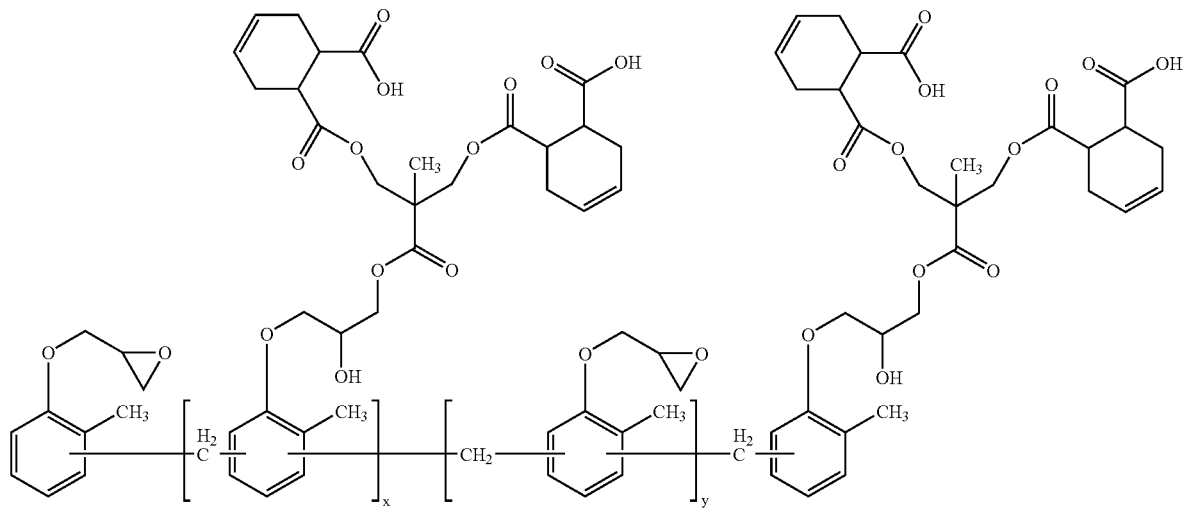

With reference to the radicals R, R', and R" shown in Scheme 1, the product of Synthesis Example 2 (Formula 1B) has the radical structures:

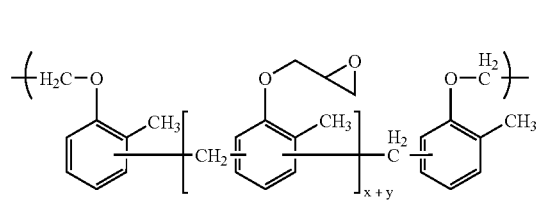

enylphosphine were added. The temperature of the reaction solution was increased to 100° C. and the reaction was carried out for approximately 5 hours until the titerometric acid value was less than 0.5 mg KOH/g. Next, the reaction solution was cooled to 50° C. and 2.7 g (0.03 mol) of tert-butyl hydroperoxide was added and the reaction was continued for approximately 1 hour. Triphenylphosphine, which is the reaction catalyst, was oxidized and its catalytic activity was deactivated.

Next, 267 g (2.7 mol) of succinic anhydride and 114 g of cyclopentanone were charged, a reaction was carried out for 5 hours at 90° C. to yield Resin Solution A-3. The epoxide equivalent weight of the product on a solids basis was 255 g/eq and the acid value was 65 mg KOH/g.

The reaction product according to Synthesis Example 3 is believed to have the structure shown in Formula 1C wherein x+y is a real number ranging from 1 to 20, x is a real number ranging from 0 to 10, and y is a real number ranging from 1 to 10.

Next, 560 g (3.7 mol) of tetrahydrophthalic anhydride and 240 g of cyclopentanone were charged and the reaction was carried out for 5 hours at 95° C. to yield Resin Solution A-4 having 70% epoxide groups on a solids basis. The epoxy equivalent weight of the product on a solids basis was 353 g/eq and the acid value was 75 mg KOH/g.

The reaction product according to Synthesis Example 4 is believed to have the structure shown in Formula 1A wherein x+y is a real number ranging from 1 to 20, x is real number ranging from 0 to 10, and y is a real number ranging from 1 to 10.

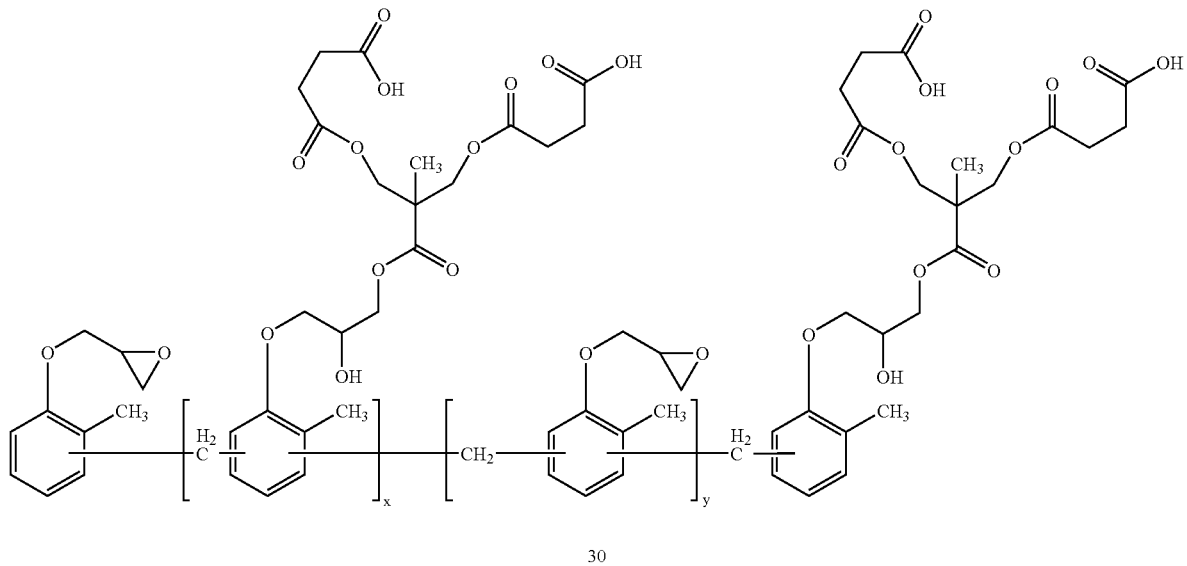

Formula 1C. Structure of product from Synthesis Example 3.

With reference to the radicals R, R', and R" shown in Scheme 1, the product of Synthesis Example 3 (Formula 1C) has the radical structures:

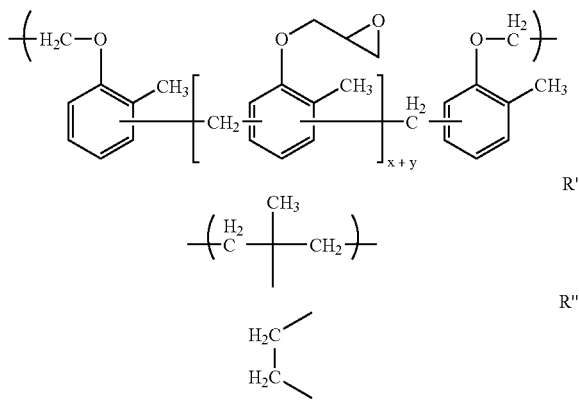

Synthesis Example 4

Preparation of Resin Solution A-4

Cresol novolac epoxy resin EOCN-4400H, manufactured by Nippon Kayaku Ltd., Tokyo, Japan, (softening point, 60° C.; epoxide equivalent weight 190 eq/g) 1900 g (10 equivalents), 295 g (2.2 mol) of dimethylol propionic acid and 941 g of cyclopentanone were charged into a resin flask and the resulting mixture was heated at 90° C. until the reaction mixture dissolved. The temperature of the reaction solution was increased to 140° C. and the reaction was continued for approximately 10 hours under nitrogen atmosphere until the titerometric acid value was less than 0.5 mg KOH/g.

Photoresist Formulation Examples 1 to 10

The photoresist components were mixed in sealed, amber round bottles on a ball mill at room ambient temperature for one hour to provide the viscous, liquid photoresist compositions of the present invention as shown in Table 1 where the numerical values are parts by weight. The photoresist compositions were applied to a thickness of 60 μm on a gold-sputtered silicon wafer substrate. The coated wafer was then dried for 20 minutes at 95° C. and then allowed to cool to room temperature. Next, a negative photomask was brought into contact with the coated wafer and the resulting assembly was exposed image-wise with ultraviolet radiation from an ultra high-pressure mercury lamp at a dose of 1000 mJ/cm$^2$. Next, a heat treatment, or post exposure bake, was performed by heating the exposed wafer for 10 minutes at 95° C. The relief image was then developed by immersing the wafer for 10 minutes in a 2.38% aqueous solution of tetramethylammonium hydroxide followed by rinsing with water and drying in air. As a final step, the developed wafer has heated for 5 minutes at 100° C. to harden the resist.

The lithographic patterning, electrolytic metal plating, and stripping performance of Examples 1 through 10 were evaluated using a series of tests. These tests are further described as follows:

Patterning Characteristic Test

The aspect ratio of the pattern was determined. The aspect ratio was determined by calculating the ratio the thickness of the pattern to the width of the pattern as defined by the following equation:

Aspect ratio=(thickness of the pattern formed)÷(width of the pattern)

The results of this test are described in Table 1 Row 13 using the following codes:
○—Pattern was formed having an aspect ratio of 6 or higher.
X—Aspect ratio of 2 or less Solvent Resistance Test The hardened resist film was immersed in acetone for 30 minutes and then an adhesion test was performed by affixing cellophane tape to the hardened resist film followed by peeling the tape off the film. The results of the adhesion test were obtained by inspection using an optical microscope. The results are described in Table 1 Row 14 using the following codes and criteria:
○—No abnormalities, blistering, or peeling of the hardened resist film were observed.
X—Blisters or peeling in the hardened resist film was observed.

Plating Resistance Tests

The appearance of the plated metal structures was observed after electrolytic metal plating using optical microscopy and was evaluated by the following criteria:
○—There were no abnormalities in the resist and in which there were no blisters or adhesion loss in the resist film.
X—There were occurrences of blisters and adhesion loss in the resist film.

Plating resistance was determined by exposing the resist film derived from Example 10 to the action of nickel, copper, lead-tin solder, and gold plating baths. The details of the plating baths used are:

Electrolytic nickel plating bath: The nickel plating solution was an aqueous solution containing nickel sulfamate (400 g/L), nickel chloride (30 g/L), and boric acid (20 g/L). Nickel plating was carried out using this nickel plating solution at 55° C. using a current density of 5 A/dm$^2$ and a plating time of 50 minutes. Using these conditions, nickel structures 50 μm in thickness were obtained. The results of this test are summarized in Table 1 Row 15.

Electrolytic copper plating bath: Copper plating was carried out using a commercial copper plating solution (CU-BRITE BU, manufactured by EBARA-UDYLITE Co., Ltd., Tokyo, Japan) at 22° C. using a current density of 3 A/dm$^2$ and a total plating time of 75 minutes. This treatment formed 50 μm thick copper patterns in the open areas of the photoresist pattern. No peeling of the photoresist or underplating of the photoresist pattern was observed. The results of this test are summarized in Table 1 Row 16.

Electrolytic tin-lead solder bath: Solder plating was carried out using a commercial solder plating solution (MX M03069.574A1, manufactured by ISHIHARA CHEMICAL Co., Ltd., Kobe, Japan) at 20° C. using a current density of 4 A/dm$^2$ and a total plating time of 30 minutes. This treatment formed 30 μm thick solder metal structures in the open areas of the photoresist pattern. No peeling of the photoresist or underplating of the photoresist pattern was observed. The results of this test are summarized in Table 1 Row 17.

Electrolytic gold bath: Gold plating was carried out using a commercial gold plating solution (EX3000, manufactured by JAPAN PURE CHEMICAL Co., Ltd., Tokyo, Japan). The results of this test are summarized in Table 1 Row 18.

Resist Stripping Characteristics

The plated resist structures were subject to the action of a stripping solution containing 50 parts of dimethyl sulfoxide and 50 parts of 1-methyl-2-pyrrolidinone for 2 hours at 80° C. The external appearance of the structure was observed after resist stripping and evaluations were made by the following criteria:
○—The entire resist peeled off the wafer.
x—The resist adhered to the wafer The results for each photoresist composition are summarized in Table 1 Row 19.

Example 11

Electrolytic Plating of Combined Nickel and Gold Layers

The nickel plating solution was an aqueous solution containing nickel sulfamate (400 g/L), nickel chloride (30 g/L), and boric acid (20 g/L). Nickel plating was carried out using this nickel plating solution at 55° C. using a current density of 5 A/dm$^2$ of current and a total plating time of 30 minutes. A plated nickel structure 30 μm thick was obtained and no peeling of the photoresist or underplating of the photoresist structure was observed. The plated nickel structure was then over plated with gold using a commercial gold plating solution (EX3000, manufactured by JAPAN PURE CHEMICAL Co., Ltd., Tokyo, Japan) at 50° C. using a current density of 0.8 A/dm$^2$ and a total plating time of 6 minutes. The resulting plated metallurgy consisted of a 6 μm thick coating of gold on top of the 30 μm thick nickel structure. No peeling of the photoresist or underplating of the photoresist pattern was observed.

TABLE 1

Example Photoresist Compositions and Photoresist Characterization Test Results

| Row | Component | Function | Example Photoresist Composition | | | | | | | | | |
|---|---|---|---|---|---|---|---|---|---|---|---|---|
| | | | 1 | 2 | 3 | 4 | 5 | 6 | 7 | 8 | 9 | 10 |
| 1 | (A) Resin Solution A-1 | Film Forming Resin | 143 | | | 143 | 129 | 129 | 129 | 143 | | |
| 2 | (A) Resin Solution A-2 | Film Forming Resin | | 143 | | | | | | | | |
| 3 | (A) Resin solution A-3 | Film Forming Resin | | | 143 | | | | | | | |
| 4 | (A) Resin solution A-4 | Film Forming Resin | | | | | | | | | 143 | 143 |
| 5 | (B) UVI-6974 *1 | PAG | 8 | 8 | 8 | 12 | 8 | | 10 | 10 | 8 | 8 |
| 6 | (B) SP-172 *2 | PAG | | | | | | 8 | | | | |
| 7 | (D) Trimethylolpropane triglycidyl ether | Reactive Diluent | | | | | 10 | | | | | |
| 8 | (D) Celloxide 2021 *3 | Reactive Diluent | | | | | | 10 | | | | |
| 9 | (D) Xylylene dioxetane | Reactive Diluent | | | | | | | 10 | | | |

TABLE 1-continued

Example Photoresist Compositions and Photoresist Characterization Test Results

| | | | Example Photoresist Composition | | | | | | | | | |
|---|---|---|---|---|---|---|---|---|---|---|---|---|
| Row | Component | Function | 1 | 2 | 3 | 4 | 5 | 6 | 7 | 8 | 9 | 10 |
| 10 | (E) 9,10-dimethoxyanthracene | Sensitizer | | | | | | | | 0.1 | | |
| 11 | (F) Diethyl thioxanthone | Sensitizer | | | | 0.1 | | | | | | |
| 12 | S-510 *4 | Adhesion Promoter | | | | | | | | | | 1.5 |
| | Evaluation Results | | | | | | | | | | | |
| 13 | Patterning Characteristic Test | | ◯ | ◯ | ◯ | ◯ | ◯ | ◯ | ◯ | ◯ | ◯ | ◯ |
| 14 | Solvent Resistance Test | | ◯ | ◯ | ◯ | ◯ | ◯ | ◯ | ◯ | ◯ | ◯ | ◯ |
| 15 | Nickel Plating Resistance | | — | — | — | — | — | — | — | — | — | ◯ |
| 16 | Copper Plating Resistance | | — | — | — | — | — | — | — | — | — | ◯ |
| 17 | Solder (Pb—Sn) Plating Resistance | | — | — | — | — | — | — | — | — | — | ◯ |
| 18 | Gold Plating Resistance | | — | — | — | — | — | — | — | — | — | ◯ |
| 19 | Resist Stripping Characteristic | | — | — | — | — | — | — | — | — | — | ◯ |

(Table Notes)
*1: 50% propylene carbonate solution, manufactured by Dow Chemical Company, Midland, MI.
*2: 50% propylene carbonate solution, manufactured by Asahi Electrochemical Industries Ltd.
*3: 3,4-epoxycyclohexanylmethyl-3',4'-epoxycyclohexane carboxylate manufactured by Daicel Chemicals Ltd.
*4. 3-Glycidoxypropyltrimethoxy silane, manufactured by Chisso Corporation.

Example 12

Photoresist Patterning Using Electron Beam Radiation

To 100 grams of the photoresist composition of Formulation Example 10 was added with 11 grams of cyclopentanone. The resulting photoresist composition was applied to a thickness of 1 μm on a silicon wafer substrate. The wafer was then dried for 3 minutes at 95° C. and irradiated pattern-wise with electron beam radiation using a commercial electron beam lithography system (ELS-3700, manufactured by ELIONIX Co., Ltd., Tokyo, Japan). The beam dose was 5 μC/cm$^2$ at an accelerating voltage of 30 kV. The irradiated wafer was then baked for 5 minutes at 90° C. The image was developed by immersing the wafer in a 2.38% by weight aqueous solution of tetramethylammonium hydroxide followed by rinsing with water and air drying. The resulting resist relief pattern showed resolution of 1 μm pattern features.

Example 13

Preparation and Processing of a Dry Film Resist

A resin stock solution was prepared by combining 475.9 grams of a resin solution prepared according to the method of Synthesis Example 4 and 1.33 grams of FC-171 (3M Company) surfactant and roll mixing for one hour under the action of an infrared heat lamp. The stock solution was then filtered through a Whatman 5 micron Polycap™ 36HD capsule filter using 20 psi applied air pressure. A photoresist composition was prepared by combining 80 grams of the stock resin solution with 3.92 grams of prefiltered Cyracure UVI-6974 PAG, and 21.1 grams of prefiltered cyclopentanone solvent. The Cyracure UVI 6974 PAG and cyclopentanone solvent were prefiltered using a 0.45 micron Whatman syringe filter. The resulting photoresist composition was mixed on a rolling mill for one hour under the action of an infrared heat lamp. After this time, the lamp was turned off and mixing was continued overnight.

An article of dry film photoresist was prepared by coating 5 mL of the above photoresist composition onto a 3 mil thick Kapton® film substrate using an Autodraw III coating machine equipped with a #20 Mayer rod. The resulting coating was placed on an aluminum baking sheet and was then dried in a mechanical convection oven at 95° C. for 15 minutes. The thickness of the dried photoresist was determined using an ONO Sokki Digital linear gauge and was nominally 13 microns.

A four-inch square piece of the article of dry film photoresist prepared above was cut and then laminated onto a 100 mm diameter silicon wafer using a Riston® Laminating Machine using a two step lamination process. In the first step and to preheat the work piece, the dry film resist was placed resist side down on the silicon wafer and the assembly was passed through the laminating machine using a roller temperature of 85° C., an applied pressure of 0 psi, and a roller speed of 0.2 meters per minute to preheat the structure. In the second step, the preheated structure was then immediately passed through the laminating machine using a roller temperature of 85° C., an applied pressure of 55 psi, and a roller speed of 0.2 meters per minute. The resulting laminated structure was allowed to cool and then the Kapton® substrate was peeled away by hand to provide a smooth coating of photoresist on the silicon wafer. The adhesion of the photoresist to the wafer was tested by applying a piece of office tape to the coating and then pulling the tape off. There was no adhesion loss as evidenced by no damage to the coating or any photoresist adhering to the office tape. The laminated film thickness was nominally 14 μm and was measured optically using a SCI FilmTek thickness gauge. The photoresist was then exposed image-wise through a photomask using an AB-M mercury arc lamp source with a 360 nm long pass cut-off filter at an exposure energy of 420 mJ/cm$^2$. The exposed resist was given a post exposure bake treatment by heating the wafer on a hotplate at 100° C. for 1 minute. The relief image was developed by immersing the wafer in Microposit® CD 26 photoresist developer for 4 minutes. A clean relief image with well resolved 10 μm via features was obtained.

Example 14

Compatibility with Ink Jet Printer Ink

A nickel pattern formed using the resist composition of Example 1 was immersed in black ink for ink-jet printer use and was allowed to stand for 24 hours at 50° C. There were no abnormalities in the external appearance of the applied film and there were no blisters or peeling.

Example 15

Formation of Solder Columns

A photoresist relief pattern having 15 μm diameter circular features was formed using the resist composition of Example 1 and electrolytic solder plating of 50 μm in thickness was performed, after which the resist pattern was stripped. When this was done, cylindrical soldered bumps 15 μm in diameter and 50 μm in height were formed.

As is evident from the results of the evaluations summarized in Table 1, the photoresist compositions of this invention show superior patterning performance and the hardened forms thereof show superior resistance to solvents and plating chemicals and are readily removed from plated metal structures using stripper solutions. Further, because the photoresist compositions of this invention have resistance to the ink used for ink-jet printers as shown in Example 14, they show good resistance to ink jet ink and can be used for ink-jet printer heads, and, as shown in Example 15, the compositions can be used in a electroplating process for forming solder bumps. Because the plated metal patterns had aspect ratios greater than 5, the photoresist compositions of the invention are well-suited for the manufacture of MEMS and other micromachine components.

While the invention has been described above with reference to specific embodiments thereof, it is apparent that many changes, modifications, and variations can be made without departing for the inventive concept disclosed herein. Accordingly, it is intended to embrace all such changes modifications, and variations that fall within the spirit and broad scope of the appended claims. All patent applications, patents, and other publications cited herein are incorporated by reference in their entirety.

What is claimed is:

1. A method of forming a metal pattern, comprising the steps of:
    applying a photoresist composition to a substrate, said photoresist composition comprising one or more cationically polymerizable resin components (A) bearing in their structures epoxide groups and carboxylic acid groups wherein resin component A is described by the following Formula 1;

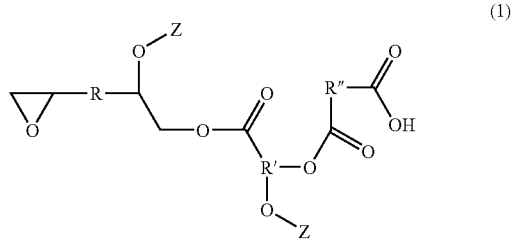

(1)

wherein Z is H or —COR"COOH; and wherein groups R, R', and R" are individually selected from the group consisting of monomeric, oligomeric or polymeric organic bridging groups, with one or more photoacid generator compounds (B), and one or more solvents (C)
    evaporating most of said solvents by heating to form a film of said photoresist composition on said substrate;
    irradiating said film through a mask with active rays to form irradiated regions;
    heating said irradiated regions to affect crosslinking;
    developing said film to form an image of hardened photoresist;
    forming a metal pattern on said substrate by electrolytic or non-electrolytic plating, said metal pattern having dimensions defined by said image of said hardened photoresist; and
    removing said hardened photoresist to produce said metal pattern.

2. The method of claim 1, wherein the epoxy equivalent of resin component (A) is 100 to 1000 and the acid value is 10 to 200 mg KOH/g.

3. The method of claim 2, wherein said photoresist composition further comprises a reactive monomer component (D).

4. The method of claim 2, wherein said photoresist composition further comprises a photosensitizer component (E).

5. The method of claim 3, wherein said photoresist composition further comprises a photosensitizer component (E).

6. The method of claim 1, wherein said photoresist composition further comprises a dye component (F) having an absorption at 365 nm of 15/cm·g/L or greater.

7. The method of claim 1, wherein said photoresist composition further comprises a dissolution rate control agent (G).

8. The method of claim 1, wherein the groups R, R' and R" are individually selected from the groups consisting of aliphatic, cycloaliphatic, aryl, polyaryl, alkyl-aryl, fused cycloaliphatic, fused aryl, and fused alkyl-aryl bridging groups.

9. The method of claim 1, wherein said active rays are ultraviolet rays, near-ultraviolet rays, X-rays or electron beam radiation.

10. The method of claim 9, in which the aspect ratio is 1 to 100.

11. The method of claim 1, wherein said metal pattern is used in an electronic component.

12. The method of claim 11, in which the electronic component is an MEMS component, a micromachine component, a μ-TAS component or a microreactor component.

13. The method of claim 11, in which the electronic component is an electroconductive layer or a metallic bump interconnection.

14. The method of claim 11, in which the electronic component is an ink-jet printer head.

15. A method of forming a metal a pattern, comprising the steps of:
    applying a dry film photoresist composition to a substrate, said dry film photoresist composition comprising one or more cationically polymerizable resin components (A) bearing in their structures epoxide groups and carboxylic acid groups wherein resin component A is described by the following Formula 1;

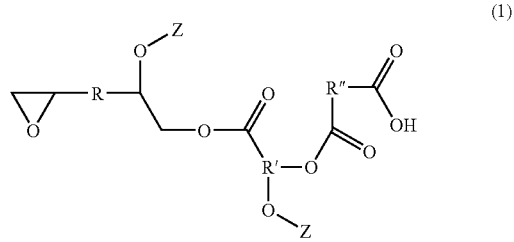

(1)

wherein Z is H or —COR"COOH; and wherein groups R, R', and R" are individually selected from the group consisting of monomeric, oligomeric or polymeric organic bridging groups, with one or more photoacid generator compounds (B);

irradiating said film through a mask with active rays to form irradiated regions;

heating said irradiated regions to affect crosslinking;

developing said film to form an image of hardened photoresist;

forming a metal pattern on said substrate by electrolytic or non-electrolytic plating, said metal pattern having dimensions defined by said image of said hardened photoresist; and removing said hardened photoresist to produce said metal pattern.

16. The method of claim 15, wherein the epoxy equivalent of resin component (A) is 100 to 1000 and the acid value is 10 to 200 mg KOH/g.

17. The method of claim 16, wherein said dry film photoresist composition further comprises a reactive monomer component (D).

18. The method of claim 16, wherein said photoresist composition further comprises a photosensitizer component (E).

19. The method of claim 17, wherein said photoresist composition further comprises a photosensitizer component (E).

20. The method of claim 15, wherein said photoresist composition further comprises a dye component (F) having an absorption at 365 nm of 15/cm·g/L or greater.

21. The method of claim 15, wherein said photoresist composition further comprises a dissolution rate control agent (G).

22. The method of claim 15, wherein the groups R, R' and R" are individually selected from the groups consisting of aliphatic, cycloaliphatic, aryl, polyaryl, alkyl-aryl, fused cycloaliphatic, fused aryl, and fused alkyl-aryl bridging groups.

23. The method of claim 15, wherein said active rays are ultraviolet rays, near-ultraviolet rays, X-rays or electron beam radiation.

24. The method of claim 23, in which the aspect ratio is 1 to 100.

25. The method of claim 15, wherein said metal pattern is used in an electronic component.

26. The method of claim 25, wherein said electronic component is an MEMS component, a micromachine component, a μ-TAS component or a microreactor component.

27. The method of claim 25, wherein the electronic component is an electroconductive layer or a metallic bump interconnection.

28. The method of claim 25, wherein the electronic component is an ink-jet printer head.

* * * * *

UNITED STATES PATENT AND TRADEMARK OFFICE
CERTIFICATE OF CORRECTION

| | | |
|---|---|---|
| PATENT NO. | : 7,282,324 B2 | Page 1 of 1 |
| APPLICATION NO. | : 11/028455 | |
| DATED | : October 16, 2007 | |
| INVENTOR(S) | : William Weber et al. | |

It is certified that error appears in the above-identified patent and that said Letters Patent is hereby corrected as shown below:

In column 1, following the title of the invention at line 5, please insert

CROSS-REFERENCE TO RELATED APPLICATIONS

This Application claims the benefit of U.S. Provisional Application Serial No. 60/534,237 filed January 5, 2004.

Signed and Sealed this

Sixteenth Day of September, 2008

JON W. DUDAS
*Director of the United States Patent and Trademark Office*